United States Patent
Nishida et al.

(10) Patent No.: US 11,424,271 B2
(45) Date of Patent: Aug. 23, 2022

(54) FERROELECTRICITY AND THERMAL RETENTION THROUGH IN SITU HYDROGEN PLASMA TREATMENT OF DOPED HAFNIUM OXIDE

(71) Applicant: University of Florida Research Foundation, Inc., Gainesville, FL (US)

(72) Inventors: Toshikazu Nishida, Gainesville, FL (US); Saeed Moghaddam, Gainesville, FL (US); Glen H. Walters, Boise, ID (US); Aniruddh Shekhawat, Gainesville, FL (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 0 days.

(21) Appl. No.: 16/998,267

(22) Filed: Aug. 20, 2020

(65) Prior Publication Data
US 2021/0057455 A1   Feb. 25, 2021

Related U.S. Application Data

(60) Provisional application No. 62/891,238, filed on Aug. 23, 2019.

(51) Int. Cl.
*H01L 21/00* (2006.01)
*H01L 27/00* (2006.01)
(Continued)

(52) U.S. Cl.
CPC .... *H01L 27/1225* (2013.01); *H01L 21/02565* (2013.01); *H01L 27/11502* (2013.01)

(58) Field of Classification Search
CPC .......... H01L 21/02565; H01L 21/022; H01L 21/02181; H01L 21/02274; H01L 21/0228;
(Continued)

(56) References Cited

U.S. PATENT DOCUMENTS

| | | | |
|---|---|---|---|
| 6,921,702 B2 * | 7/2005 | Ahn | C23C 16/405 |
| | | | 438/287 |
| 9,431,609 B2 * | 8/2016 | Dang | H01L 45/147 |

(Continued)

OTHER PUBLICATIONS

Tang et al., "Resistive switching in atomic layer deposited HfO2/ZrO2 nanolayer stacks", 2020, Applied Surface Science, vol. 515, 146015, (available on line Mar. 10, 2020). (Year: 2020).*

(Continued)

*Primary Examiner* — Nikolay K Yushin
(74) *Attorney, Agent, or Firm* — Thomas | Horstemeyer, LLP (57) ABSTRACT

Various examples are provided related to hydrogen plasma treatment of hafnium oxide. In one example, a method includes depositing a monolayer of a precursor on a first oxide monolayer; forming a second oxide monolayer by applying an oxygen ($O_2$) plasma to the monolayer of the precursor; and creating oxygen vacancies in the second oxide monolayer by applying a hydrogen ($H_2$) plasma to the second oxide monolayer. In another example, a device includes a hafnium oxide ($HfO_2$) based ferroelectric thin film on a first side of a substrate and an electrode layer disposed on the $HfO_2$ based ferroelectric thin film opposite the substrate. The $HfO_2$ film includes a plurality of oxide monolayers including at least one $HfO_2$ monolayer, each of the plurality of oxide monolayers having oxygen vacancies distributed throughout that oxide monolayer.

19 Claims, 5 Drawing Sheets

For HZO, HfO2 can be replaced with ZrO2 in certain layers to create different doping distributions (51) Int. Cl.
  *H01L 27/12*     (2006.01)
  *H01L 21/02*     (2006.01)
  *H01L 27/11502*  (2017.01)

(58) Field of Classification Search
  CPC .......... H01L 21/02189; H01L 27/1225; H01L 27/11502; H01L 27/1248; H01L 27/3262; H01L 27/14616; H01L 28/40; H01L 28/60; H01L 28/55; H01L 28/75; H01L 27/1207; H01L 27/2463; H01L 27/224; H01L 27/2483
  See application file for complete search history.

(56)             References Cited

U.S. PATENT DOCUMENTS

| 10,199,394    | B2* | 2/2019 | Yamazaki | H01L 29/78606 |
| 2004/0023461  | A1* | 2/2004 | Ahn      | H01L 21/28185 |
|               |     |        |          | 438/287       |
| 2015/0108474  | A1* | 4/2015 | Yamazaki | H01L 27/1225  |
|               |     |        |          | 257/43        |
| 2016/0049584  | A1* | 2/2016 | Dang     | H01L 45/147   |
|               |     |        |          | 257/4         |

OTHER PUBLICATIONS

Zhou et al., "The effects of oxygen vacancies on ferroelectric phase transition of HfO2-based thin film from first-principle", 2019, Computational Materials Science, 167, pp. 143-150, available on line May 27, 2019 (Year: 2019).*

* cited by examiner

FIG. 1

FIG. 2A — Pulse Hf-precursor

FIG. 2B — Purge Hf Precursor

FIG. 2C — Apply $O_2$ Plasma

FIG. 2D — Stop Plasma (Oxide Formed)

FIG. 2E — Apply Hydrogen Plasma ($H_2$)

FIG. 2F — $H_2$ Plasma Creates Vacancies

FIG. 2G — Repeat Process until desired thickness is reached

FERROELECTRICITY AND THERMAL RETENTION THROUGH IN SITU HYDROGEN PLASMA TREATMENT OF DOPED HAFNIUM OXIDE

CROSS REFERENCE TO RELATED APPLICATIONS

This application claims priority to, and the benefit of, U.S. provisional application entitled "IMPROVED FERROELECTRICITY AND THERMAL RETENTION THROUGH IN SITU HYDROGEN PLASMA TREATMENT OF DOPED HAFNIUM OXIDE" having Ser. No. 62/891,238, filed Aug. 23, 2019, which is hereby incorporated by reference in its entirety.

STATEMENT REGARDING FEDERALLY SPONSORED RESEARCH OR DEVELOPMENT

This invention was made with government support under 1610387 awarded by the National Science Foundation. The government has certain rights in the invention.

BACKGROUND

Ferroelectric random access memory (FeRAM) shows promise as an emerging technology. FeRAM displays significantly lower operation voltage, read/write times, and much higher endurance than flash. FeRAM is comparable to SRAM in terms of read/write times, endurance, and operation voltage current, but exceeds SRAM with a much smaller cell size and retention. (non-volatile vs. volatile). Current FeRAM technologies suffer from the pitfall of poor scalability and difficulty integrating into the CMOS process. Ferroelectric hafnium oxide is a new and growing field that offers a solution.

SUMMARY

Aspects of the present disclosure are related to hydrogen plasma treatment of hafnium oxide. In one aspect, among others, a method comprises depositing a monolayer of a precursor on a first oxide monolayer; forming a second oxide monolayer by applying an oxygen ($O_2$) plasma to the monolayer of the precursor; and creating oxygen vacancies in the second oxide monolayer by applying a hydrogen ($H_2$) plasma to the second oxide monolayer. The precursor can be a hafnium (Hf) precursor and the second oxide monolayer is a hafnium oxide ($HfO_2$) monolayer.

In one or more aspects, the first oxide monolayer can be a zirconium oxide ($ZrO_2$) monolayer. The first oxide monolayer can be a hafnium oxide ($HfO_2$) monolayer. The precursor can be a zirconium (Zr) precursor and the second oxide monolayer is a zirconium oxide ($ZrO_2$) monolayer. The first oxide monolayer can be disposed on a substrate. The substrate can comprise silicon (Si) or germanium (Ge). The substrate can comprise a metal layer upon which the first oxide monolayer is deposited. The metal layer can comprise titanium nitride (TiN), iridium (Ir), ruthenium (Ru), platinum (Pt) or molybdenum (Mo).

In various aspects, the method can comprise depositing a monolayer of a second precursor on the second oxide monolayer; and forming a third oxide monolayer by applying an oxygen ($O_2$) plasma to the monolayer of the second precursor. The second precursor can be a hafnium (Hf) precursor and the third oxide monolayer can be a hafnium oxide ($HfO_2$) monolayer. The precursor can be a zirconium (Zr) precursor and the second oxide monolayer can be a zirconium oxide ($ZrO_2$) monolayer. The method can comprise creating oxygen vacancies in the third oxide monolayer by applying a hydrogen ($H_2$) plasma to the third oxide monolayer.

In another aspect, a device comprises a substrate; a hafnium oxide ($HfO_2$) based ferroelectric thin film on a first side of the substrate, the $HfO_2$ film comprising a plurality of oxide monolayers including at least one $HfO_2$ monolayer, each of the plurality of oxide monolayers having oxygen vacancies distributed throughout that oxide monolayer; and an electrode layer disposed on the $HfO_2$ based ferroelectric thin film opposite the substrate. The plurality of oxide monolayers can include a plurality of adjacent $HfO_2$ monolayers. The plurality of oxide monolayers can comprise a $ZrO_2$ monolayer disposed between two $HfO_2$ monolayers. The plurality of oxide monolayers can comprise a plurality of alternating $HfO_2$ and $ZrO_2$ monolayers, where the plurality of oxide monolayers includes a plurality of $HfO_2$ and a plurality of $ZrO_2$ monolayers.

In one or more aspects, the device can comprise a metal layer disposed between the $HfO_2$ based ferroelectric thin film and the first side of the substrate. The metal layer can comprise titanium nitride (TiN), iridium (Ir), ruthenium (Ru), platinum (Pt) or molybdenum (Mo). The substrate can comprise silicon (Si) or germanium (Ge). The $HfO_2$ monolayers can be doped.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Disclosed herein are various examples related to hydrogen plasma treatment of hafnium oxide. Reference will now be made in detail to the description of the embodiments as illustrated in the drawings, wherein like reference numbers indicate like parts throughout the several views.

Hafnium oxide based ferroelectric thin films have been explored over the past decade since the discovery that silicon doped hafnium oxide could produce a hysteresis and remanent polarization. Varying the silicon doping has been shown to result in an array of films from ferroelectric to anti-ferroelectric. Other dopants such as Al, Gd, La, Zr, and Y can also produce ferroelectricity in hafnium oxide films. Similarly, in a hafnia-zirconia solid solution, varying the ratio of $HfO_2$ to $ZrO_2$ produces a wide range of ferroelectric and anti-ferroelectric films. Aside from dopants alone, ferroelectricity may be affected by a number of factors including deposition temperature, post-metallization annealing, oxidation pulse time during atomic layer depositions (ALD), and the oxygen flow rate during sputter depositions.

Figure 1:
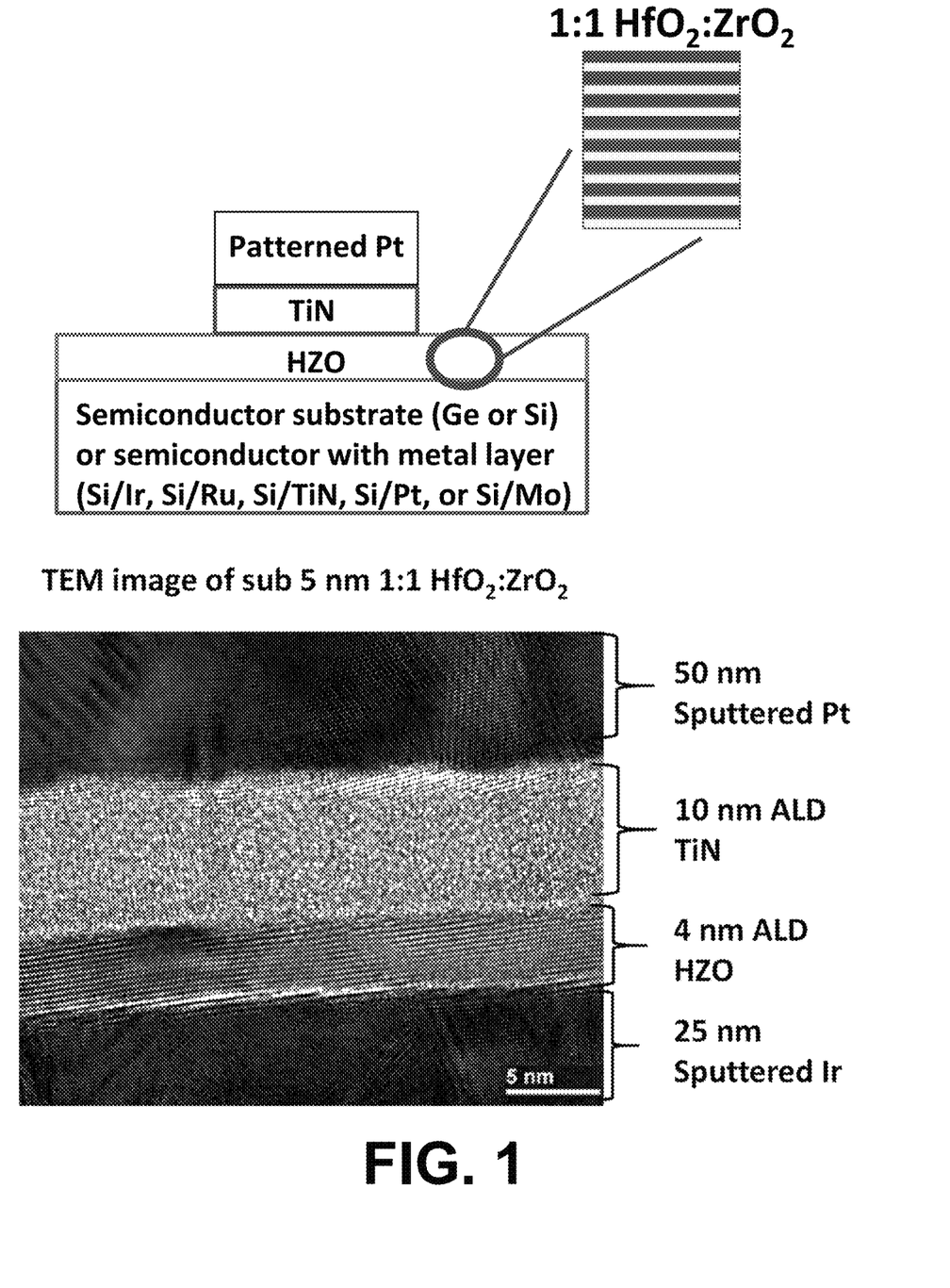
FIG. 1 illustrates an example of a capacitor structure including a hafnium zirconium oxide (HZO) film, in accordance with various embodiments of the present disclosure.

Ferroelectric hafnium is highly CMOS compatible, and due to its ultra-thin nature, provides excellent scalability for a wide range of applications. For example, ferroelectric random access memory (FeRAM) can benefit from the advantages offered by $HfO_2$ based ferroelectric thin films. FIG. 1 illustrates an example of a capacitor structure comprising a hafnium zirconium oxide (HZO) film disposed on a semiconductor substrate (e.g., Ge or Si) or a semiconductor with a metal layer (e.g., Si/Ir, Si/Ru, Si/TiN, Si/Pt or Si/Mo). The HZO film comprises alternating layers of $HfO_2$ and $ZrO_2$. The alternating layers can be provided in a 1:1 ratio. In the example of FIG. 1, a capping electrode of TiN is disposed on the HZO film with a platinum (Pt) electrode patterned on the TiN layer. An image of a fabricated capacitor structure with the HZO film on a layer of iridium (Ir) is shown in FIG. 1.

The capacitor structure of FIG. 1 can be fabricated on a silicon (Si) or germanium (Ge) substrate by depositing, e.g., titanium nitride (TiN) or other suitable metal (e.g., Ir) as a bottom electrode. The deposition of TiN can be performed in an atomic layer deposition (ALD) chamber using a Ti precursor and $N_2$ (nitrogen plasma). The HZO film can then be deposited using a plasma process as will be described with respect to FIGS. 2A-2G. A layer of TiN can be deposited on the HZO film as a capping electrode. A high temperature bake (anneal) can then be performed to crystalize the HZO film to produce a polycrystalline film containing the orthorhombic crystal phase which is responsible for the ferroelectric behavior. This thermal annealing step is known as a Post-Metallization Anneal (PMA) since it is performed after the TiN (metal) electrode is deposited on top of the ferroelectric layer. The bake can be performed using a rapid thermal anneal (RTA) system. For example, the anneal can be carried out for 20 seconds in an ambient nitrogen environment at temperatures in a range from about 400° C. to about 700° C., or can be carried out for 300 seconds at 350° C. Additionally, a thermal anneal can be performed prior to the top TiN capping layer. Such a thermal anneal which is done after the deposition of the ferroelectric layer but before the metallization is known as a Post-Deposition Anneal (PDA). The top Pt electrode can be patterned and deposited using, e.g., magnetron sputtering. The TiN capping layer can then be etched (e.g., in hydrogen peroxide ($H_2O_2$) heated to 65° C.). The Pt electrode is not etched by the $H_2O_2$ and can act as a hard mask to define the capacitor geometries.

Presented in this disclosure is the application of $O_2$ and sequential $O_2$, $H_2$ plasma oxidation methods to control the behavior of the resulting films from anti-ferroelectric to ferroelectric. FIGS. 2A-2G illustrate an example of the plasma oxidation methods. Beginning at FIG. 2A, the hafnium precursor is pulsed in the chamber to deposit the hafnium (Hf) on the substrate. Next, the excess hafnium precursor is purged leaving a monolayer on the substrate as shown in FIG. 2B. Oxygen plasma is then applied in FIG. 2C (e.g., for 20 seconds with a RF power of 300 Watts) to oxidize the Hf monolayer and form hafnium oxide ($HfO_2$) as shown in FIG. 2D. In some implementations, the process can return to FIG. 2A when an additional monolayer of hafnium precursor can be deposited and exposed to $O_2$ plasma to form additional monolayers of $HfO_2$. This may be repeated to form a $HfO_2$ film having a desired thickness similar to that illustrated in FIG. 2G. For example, the $HfO_2$ thickness can be in a range from about 3 nm to about 30 nm.

Figure 2A:
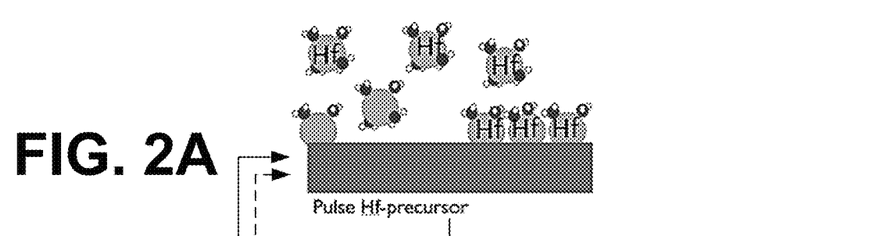
FIGS. 2A-2H are graphical representations illustrating an example of plasma treatment of hafnium oxide, in accordance with various embodiments of the present disclosure.
Figure 2B:
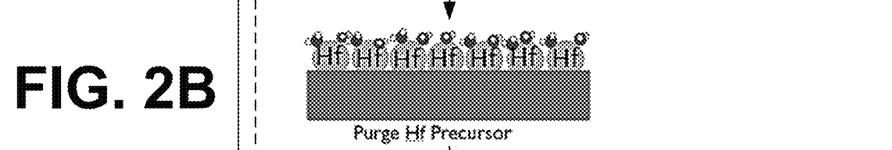
Figure 2C:
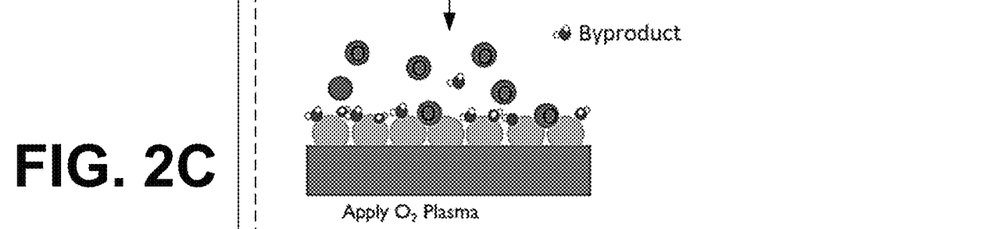
Figure 2D:
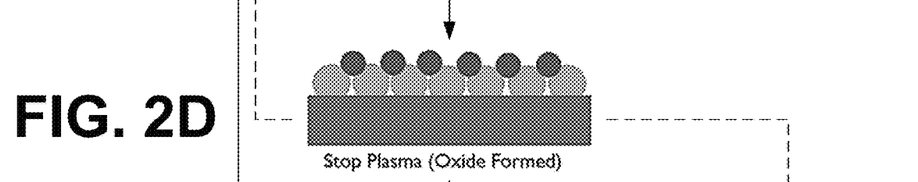
Figure 2E:
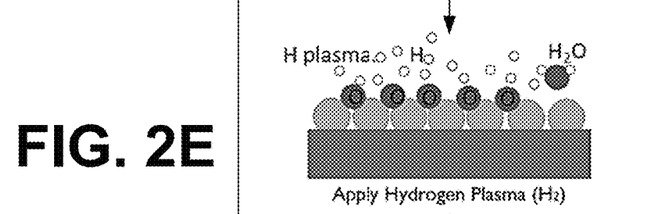
Figure 2F:
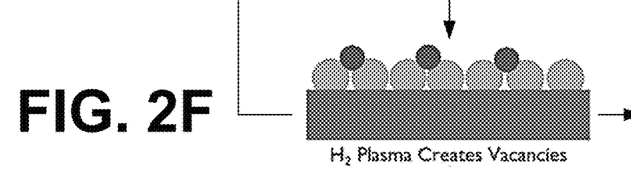
Figure 2G:
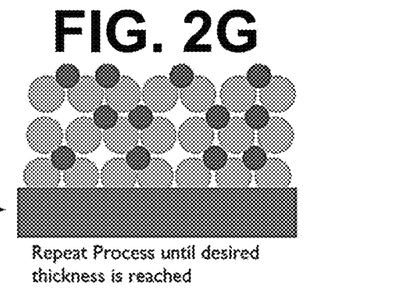
Figure 2H:
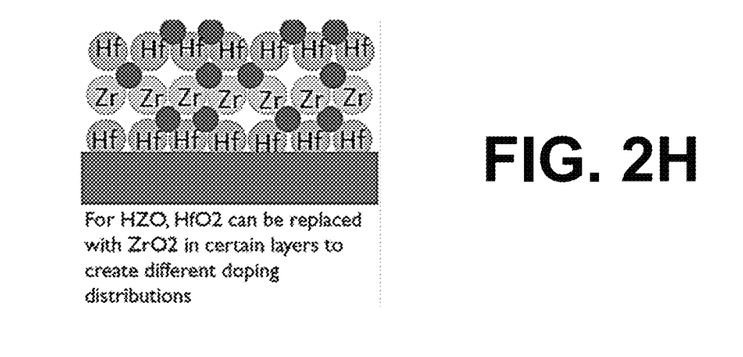

For the sequential $O_2$, $H_2$ plasma films, $O_2$ plasma is applied after the precursor pulse and then followed by $H_2$ plasma as shown in FIG. 2E. The hydrogen plasma is applied to partially reduce the oxide and create oxygen vacancies as illustrated in FIG. 2F. For example, the $H_2$ plasma time can be varied from about 1 second to about 10 seconds with a RF power of 300 Watts. This process can be repeated by returning to FIG. 2A to achieve different numbers of layers and different thicknesses as shown in FIG. 2G. Using the sequential $O_2$, $H_2$ plasma, $H_2$ plasma can be applied to every monolayer of the film (e.g., every 0.8 Å or 0.08 nm). This is different from hydrogen plasma treatment after the film is grown with completely different film properties.

It has been found that the best performance comes from 1:1 layering of $HfO_2$ and $ZrO_2$. In some embodiments, the 1:1 ratio can be maintained but with deposition of thicker $HfO_2$ or $ZrO_2$ layers (e.g., 2 Å:2 Å or 5 Å:5 Å). For example, the total film thickness can be in a range from about 3 nm to about 30 nm for a good ferroelectric film. As the layer thicknesses increase, the desired electrical performance will be lost because the device will start to behave as one with two different films instead of a homogeneous mixture. Pure $ZrO_2$ is anti-ferroelectric above a certain thickness and $HfO_2$ is weakly ferroelectric.

The process of FIGS. 2A-2G can also be used to produce a HZO film by alternating the Hf precursor with a Zr precursor to form monolayers of $ZrO_2$. In FIG. 2A, the zirconium precursor is pulsed, and purged in FIG. 2B. Next, $O_2$ plasma can be applied (e.g., for 20 seconds) to oxidize the monolayer and create $ZrO_2$. $H_2$ plasma can then be applied to partially reduce the oxide and create oxygen vacancies. In this way, certain monolayers of $HfO_2$ can be replaced with $ZrO_2$ to create different doping distributions. As can be seen, different distribution combinations of $O_2$ and sequential $O_2$, $H_2$ plasma oxidation can be achieved. This approach can continue layer by layer, with a growth rate of about 0.8 Å a cycle (precursor+$O_2$+$H_2$ plasma). For a 10 nm thick film, 124 cycles are applied.

Hysteresis results demonstrate the effect of the sequential $O_2$, $H_2$ plasma on the remanent polarization (Pr). For film thicknesses of 10, 8, and 6 nm, the sequential $O_2$, $H_2$ plasma films have the highest virgin state Pr of 18, 16, and 13 $\mu C/cm^2$ compared to 9, 5, and 1.4 $\mu C/cm^2$ for $H_2O$ films, and <1 $\mu C/cm^2$ for $O_2$ plasma films at 10 and 8 nm (where the films are anti-ferroelectric) and 0 $\mu C/cm^2$ at 6 and 4.5 nm (where the films are paraelectric). Further still, in the virgin state the sequential $O_2$, $H_2$ plasma film at 4.5 nm displays anti-ferroelectricity whereas the $H_2O$ and $O_2$ plasma films are paraelectric.

Endurance tests of the films were carried out via PUND pulses. As with the hysteresis results, the large virgin state polarization is readily apparent for the sequential $O_2$, $H_2$ plasma films, whereas the HZO films require wake-up cycling of $10^6$ switching cycles to match the switched polarization of 34 $\mu C/cm^2$ attained by the sequential $O_2$, $H_2$ plasma film at 10 and 8 nm. At 4.5 nm, only the sequential $O_2$, $H_2$ plasma film showed a switched polarization, appearing initially anti-ferroelectric but waking up to a switched polarization of 7.6 $\mu C/cm^2$ after $10^7$ switching cycles.

The use of $O_2$ and sequential $O_2$, $H_2$ plasma during the ALD process offers significant tuning of the hafnium zirconium oxide (HZO) film properties from anti-ferroelectric to ferroelectric. One significant effect of the sequential $O_2$, $H_2$ plasma process is the occurrence of the ferroelectric phase after PDA. Without this process, the occurrence of significant ferroelectricity typically requires the PMA step after the capping TiN metallization step. It is theorized that the application of the $H_2$ plasma during deposition is able to partially reduce the previously deposited oxide, generating oxygen vacancies and enhancing the orthorhombic phase. Among three different oxidizing conditions applied during ALD deposition of 4.5, 6, 8, and 10 nm thick HZO films, the addition of the $H_2$ plasma after the oxidation treatment increased the virgin state switched polarizations compared to $H_2O$ and $O_2$ plasma films. The $O_2$ plasma films were initially anti-ferroelectric and required $10^8$ switching cycles to open the hysteresis loop. Additionally, the sequential $O_2$, $H_2$ plasma films had the best thickness scalability with the 10, 8, and 6 nm films exhibiting switched polarizations of about 34 $\mu C/cm^2$ after $10^6$ switching cycles. This addition of $H_2$ plasma during ALD improves the remanent polarization and thermal retention of the resulting devices over films which have not been treated with hydrogen plasma. Strong thermal retention is important for commercial adoption of ferroelectric hafnium zirconium oxide films for nonvolatile memory device applications.

Experiment

Atomic layer deposition of 1:1 hafnium zirconium oxide films (HZO) was carried out using tetrakis(dimethylamido) hafnium(IV) (TDMAH) and tetrakis(dimethylamido)zirconium(IV) (TDMAZ). Three different oxidizing treatments were utilized: $H_2O$, $O_2$ plasma, and sequential $O_2$, $H_2$ plasma. For the sequential $O_2$, $H_2$ plasma films, $O_2$ plasma was applied after the precursor pulse followed by $H_2$ plasma. Using the three oxidizing conditions, 4.5, 6, 8, and 10 nm thick films were grown by employing the tiered deposition method described previously. From ellipsometry measurements of the about 10 nm thick HZO films grown directly on silicon, the growth rate for $H_2O$ oxidized films was determined to be 1 Å per cycle, whereas the growth rate for both $O_2$ and sequential $O_2$, $H_2$ plasma films was slightly lower at 0.8 Å per cycle.

Bottom electrodes of 10 nm thick TiN were fabricated on p+ silicon using tetrakis(dimethylamido)titanium(IV) (TDMAT) and nitrogen plasma. Top electrodes of TiN were similarly deposited, sandwiching the above HZO films to form a metal-ferroelectric-metal (MFM) film stack. MFM capacitors were fabricated by sputtering 50 nm thick platinum which, following lift-off, was used as a hard mask to etch the exposed TiN in $H_2O_2$ heated to 65° C., creating device areas ranging from 1600 to 14400 pmt. A rapid thermal anneal (RTA) was carried out at 500° C. for 20 s in $N_2$. Hysteresis and positive-up-negative-down (PUND) tests were carried out with an Agilent 33500B waveform generator and a Tektronix TDS5104B oscilloscope. Hysteresis measurements were taken at 1 and 2 kHz while PUND tests were executed with 1-10-1 μs pulses. Wake-up cycling was performed at 100 kHz with a bipolar square wave.

Test Results

Figure 3:
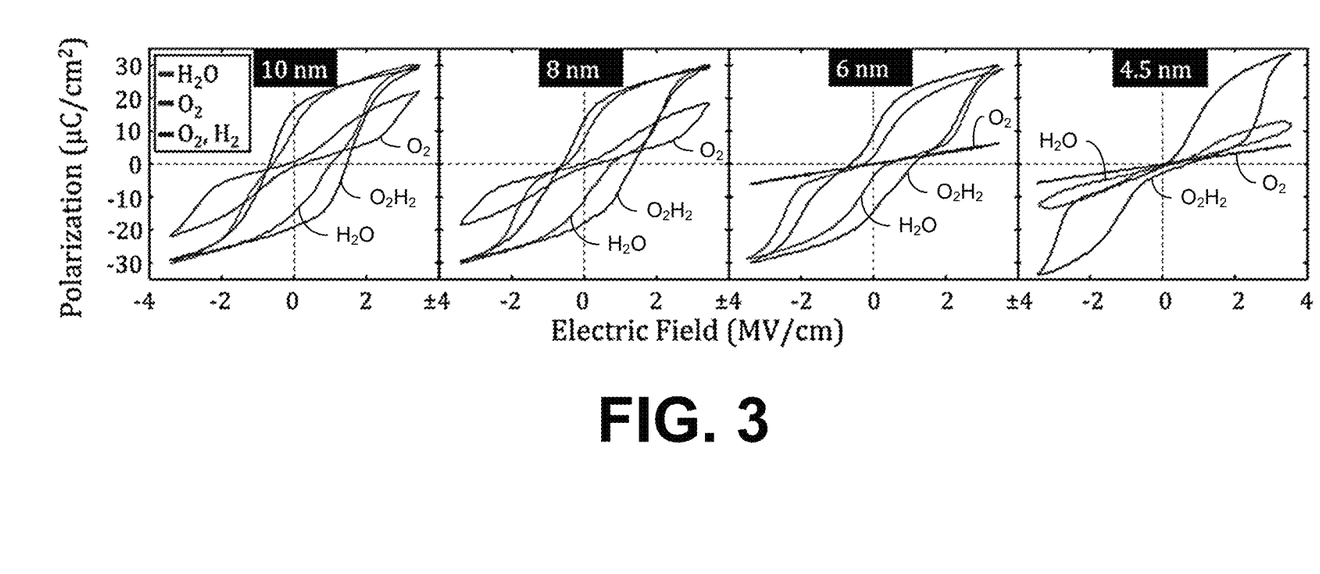
FIG. 3 illustrates examples of hysteresis curves of HZO films prepared using $H_2O$, $O_2$ plasma, and sequential $O_2$, $H_2$ plasma oxidizing conditions during ALD, in accordance with various embodiments of the present disclosure.

Hysteresis results shown in FIG. 3 demonstrate the effect of the sequential $O_2$, $H_2$ plasma on the remanent polarization (Pr). The hysteresis curves were collected in the virgin state before applying any electric field cycling. For film thicknesses of 10, 8, and 6 nm, the sequential $O_2$, $H_2$ plasma films have the highest virgin state Pr of 18, 16, and 13 $\mu C/cm^2$ compared to 9, 5, and 1.4 $\mu C/cm^2$ for $H_2O$ films, and <1 $\mu C/cm^2$ for $O_2$ plasma films at 10 and 8 nm (where the films are anti-ferroelectric) and 0 $\mu C/cm^2$ at 6 and 4.5 nm (where the films are paraelectric). Further still, in the virgin state the sequential $O_2$, $H_2$ plasma film at 4.5 nm displays anti-ferroelectricity whereas the $H_2O$ and $O_2$ plasma films are paraelectric.

Figure 4:
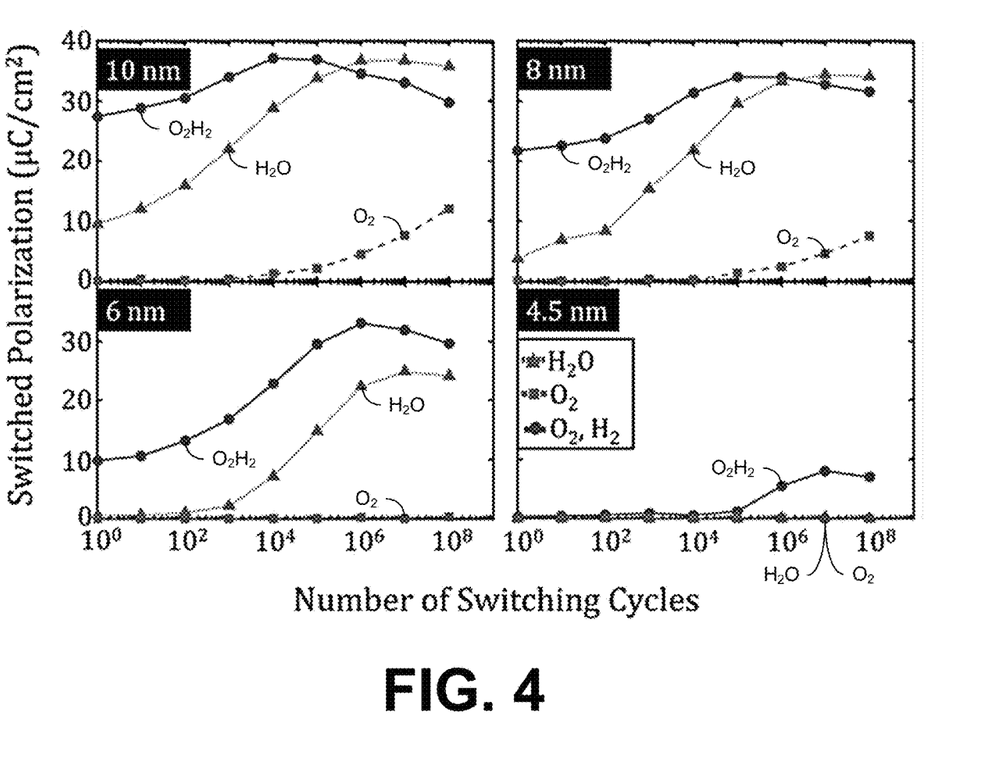
FIG. 4 illustrates examples of endurance testing of the $H_2O$, $O_2$ plasma, and sequential $O_2$, $H_2$ plasma films, in accordance with various embodiments of the present disclosure.

Endurance tests of the films were carried out via PUND pulses. FIG. 4 shows the net switched polarization obtained from the responses of the positive minus up pulses for the films across the four thickness deposited. As with the hysteresis results, the large virgin state polarization is readily apparent for the sequential $O_2$, $H_2$ plasma films, whereas the $H_2O$ films require wake-up cycling of $10^6$ switching cycles to match the switched polarization of 34 $\mu C/cm^2$ attained by the sequential $O_2$, $H_2$ plasma film at 10 and 8 nm. At 4.5 nm, only the sequential $O_2$, $H_2$ plasma film showed a switched polarization, appearing initially anti-ferroelectric but waking up to a switched polarization of 7.6 $\mu C/cm^2$ after $10^7$ switching cycles. The $O_2$ plasma films are initially anti-ferroelectric at 10 and 8 nm but eventually develop non-zero switched polarizations of 12 and 7.4 $\mu C/cm^2$ after $10^8$ switching cycles. The onset of fatigue is seen in the sequential $O_2$, $H_2$ plasma films after $10^6$ cycles, however, the rate of fatigue is reduced, allowing for a switched polarization to be maintained above 30 $\mu C/cm^2$ for the 10, 8, and 6 nm films after $10^8$ switching cycles. Interestingly, at 10 and 8 nm, the $O_2$ plasma films did not show any fatigue and continued to wake-up, up to $10^8$ switching cycles.

Figure 5A:
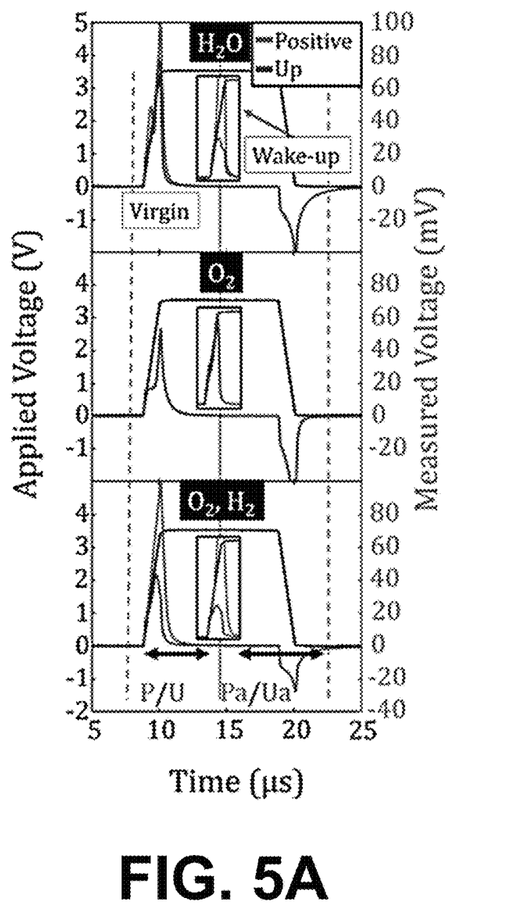
FIGS. 5A and 5B illustrate examples of the raw voltage response and dynamic switching current of the 10 nm $H_2O$, $O_2$ plasma, and sequential $O_2$, $H_2$ plasma films, in accordance with various embodiments of the present disclosure.
Figure 5B:
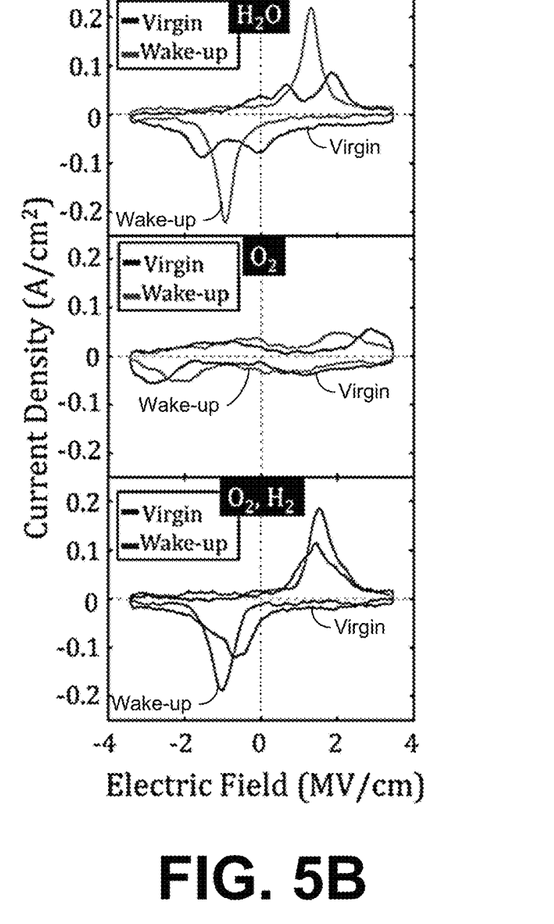

The differences in switched polarization and wake-up between the films can be illustrated by examining the raw voltage responses from the PUND pulses. FIG. 5A shows the applied and measured voltages for the positive and up pulses of the 10 nm films in the virgin state. Both the $H_2O$ and sequential $O_2$, $H_2$ plasma films have similar voltage responses for the first positive pulse (P), however the voltage response for the up pulse (U) of the $H_2O$ film nearly matches that of the previous positive pulse (P), whereas for the sequential $O_2$, $H_2$ plasma film, the voltage response for the up pulse (U) is much smaller. Hence the net switched polarization ((P-Pa)-(U-Ua)), which is the applicable polarization required for memory applications, is low for the $H_2O$ film but high for the sequential $O_2$, $H_2$ plasma film. This implies the $H_2O$ film has significant relaxation in the virgin state. The insets in FIG. 5A show the voltage response after $10^6$ wake-up switching cycles. After cycling, the U response for the $H_2O$ film is much lower, resulting in the higher polarization seen for the 10 nm film in FIG. 4 after $10^6$ switching cycles. For the virgin $O_2$ plasma film, both the P and U pulses overlap, giving a net positive minus up switched polarization of 0 $\rho C/cm^2$ whereas after wake-up a slight difference is seen between the P and U pulses. The dynamic switching currents in FIG. 5B further support the PUND results as the 10 nm $H_2O$ film initially has two switching peaks per polarity which merge after cycling. The sequential $O_2$, $H_2$ plasma film has one merged peak per polarity which improves after wake-up, and the $O_2$ plasma film has one small peak per polarity near the maximum applied field.

Oxygen vacancies play an important role in ferroelectric hafnium oxide from the observed wake-up effect, to charge transport through the film, and stabilization of crystal phases. Indeed, oxygen vacancies, generated by under-pulsing the oxidizing dose such as $O_3$ or $H_2O$, can induce ferroelectricity in un-doped hafnium oxide. Similar to under-oxidizing the material during growth, the improved ferroelectricity in the sequential $O_2$, $H_2$ plasma films may be attributed to the partial reduction of the deposited oxide via the subsequent $H_2$ plasma treatment. In an experiment on resistive switching in hafnium oxide, it was shown that hydrogen plasma treatment during the top TiN deposition partially reduced the underlying hafnium oxide layer and generated oxygen vacancies. Further, $H_2$ plasma can be used in ALD processes for the deposition of single-element materials and, for the case of $Al_2O_3$ and $IrO_2$, can reduce the deposited oxide.

The use of $O_2$ and sequential $O_2$, $H_2$ plasma during the ALD process offers significant tuning of the HZO film properties from anti-ferroelectric to ferroelectric. It is theorized that the application of the $H_2$ plasma during deposition is able to partially reduce the previously deposited oxide, generating oxygen vacancies and enhancing the orthorhombic phase. Among three different oxidizing conditions applied during ALD deposition of 4.5, 6, 8, and 10 nm thick HZO films, the addition of the $H_2$ plasma after the oxidation treatment increased the virgin state switched polarizations compared to $H_2O$ and $O_2$ plasma films. The $O_2$ plasma films were initially anti-ferroelectric and required $10^8$ switching cycles to open the hysteresis loop. Additionally, the sequential $O_2$, $H_2$ plasma films had the best thickness scalability with the 10, 8, and 6 nm films exhibiting switched polarizations of about 34 $\mu C/cm^2$ after $10^6$ switching cycles.

Temperature is another challenge facing the integration of hafnium based memories due to the relatively low temperature at which depole and imprint occur. When the sequential $O_2$, $H_2$ plasma films are compared to commercially available PZT, the switched positive polarization was found to be favorable. Additional details regarding the methods disclosed herein can be found in U.S. provisional application Ser. No. 62/891,238, filed Aug. 23, 2019, which is hereby incorporated by reference in its entirety.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about y".

Therefore, at least the following is claimed:

1. A method, comprising:
depositing a monolayer of a precursor on a first oxide monolayer;
forming a second oxide monolayer by applying an oxygen ($O_2$) plasma to the monolayer of the precursor; and
creating oxygen vacancies in the second oxide monolayer by applying a hydrogen ($H_2$) plasma to the second oxide monolayer.

2. The method of claim 1, wherein the precursor is a hafnium (Hf) precursor and the second oxide monolayer is a hafnium oxide ($HfO_2$) monolayer.

3. The method of claim 2, wherein the first oxide monolayer is a zirconium oxide ($ZrO_2$) monolayer.

4. The method of claim 1, wherein the first oxide monolayer is a hafnium oxide ($HfO_2$) monolayer.

5. The method of claim 4, wherein the precursor is a zirconium (Zr) precursor and the second oxide monolayer is a zirconium oxide ($ZrO_2$) monolayer.

6. The method of claim 1, wherein the first oxide monolayer is disposed on a substrate.

7. The method of claim 6, wherein the substrate comprises silicon (Si) or germanium (Ge).

8. The method of claim 6, wherein the substrate comprises a metal layer upon which the first oxide monolayer is deposited.

9. The method of claim 8, wherein the metal layer comprises titanium nitride (TiN), iridium (Ir), ruthenium (Ru), platinum (Pt) or molybdenum (Mo).

10. The method of claim 1, comprising:
depositing a monolayer of a second precursor on the second oxide monolayer; and
forming a third oxide monolayer by applying an oxygen ($O_2$) plasma to the monolayer of the second precursor.

11. The method of claim 10, comprising creating oxygen vacancies in the third oxide monolayer by applying a hydrogen ($H_2$) plasma to the third oxide monolayer.

12. The method of claim 10, wherein the second precursor is a hafnium (Hf) precursor and the third oxide monolayer is a hafnium oxide ($HfO_2$) monolayer.

13. The method of claim 12, wherein the precursor is a zirconium (Zr) precursor and the second oxide monolayer is a zirconium oxide ($ZrO_2$) monolayer.

14. A device, comprising:
a substrate;
a hafnium oxide ($HfO_2$) based ferroelectric thin film on a first side of the substrate, the $HfO_2$ based ferroelectric thin film comprising a plurality of oxide monolayers including at least one zirconium oxide ($ZrO_2$) monolayer disposed adjacent to a plurality of adjacent $HfO_2$ monolayers, each of the plurality of oxide monolayers individually formed with oxygen vacancies distributed throughout that oxide monolayer; and an electrode layer disposed on the HfO$_2$ based ferroelectric thin film opposite the substrate.

15. The device of claim 14, wherein the substrate comprises silicon (Si) or germanium (Ge).

16. The device of claim 14, wherein the plurality of oxide monolayers comprises a ZrO$_2$ monolayer disposed between two HfO$_2$ monolayers.

17. The device of claim 16, wherein the plurality of oxide monolayers comprises a plurality of alternating HfO$_2$ and Z$_{rO2}$ monolayers, wherein the plurality of oxide monolayers includes a plurality of HfO$_2$ and a plurality of ZrO$_2$ monolayers.

18. The device of claim 14, comprising a metal layer disposed between the HfO$_2$ based ferroelectric thin film and the first side of the substrate.

19. The device of claim 18, wherein the metal layer comprises titanium nitride (TiN), iridium (Ir), ruthenium (Ru), or molybdenum (Mo).

* * * * *